United States Patent
Ellis-Monaghan et al.

(10) Patent No.: US 9,236,449 B2
(45) Date of Patent: Jan. 12, 2016

(54) HIGH VOLTAGE LATERALLY DIFFUSED METAL OXIDE SEMICONDUCTOR

(71) Applicant: INTERNATIONAL BUSINESS MACHINES CORPORATION, Armonk, NY (US)

(72) Inventors: John J. Ellis-Monaghan, Grand Isle, VT (US); Theodore J. Letavic, Putnam Valley, NY (US); Santosh Sharma, Essex Junction, VT (US); Yun Shi, South Burlington, VT (US); Michael J. Zierak, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1 day.

(21) Appl. No.: 13/939,231

(22) Filed: Jul. 11, 2013

(65) Prior Publication Data
US 2015/0014769 A1     Jan. 15, 2015

(51) Int. Cl.
*H01L 29/808* (2006.01)
*H01L 29/66* (2006.01)
*H01L 29/78* (2006.01)
(Continued)

(52) U.S. Cl.
CPC ...... *H01L 29/66681* (2013.01); *H01L 29/1058* (2013.01); *H01L 29/4983* (2013.01); *H01L 29/66893* (2013.01); *H01L 29/66901* (2013.01); *H01L 29/735* (2013.01);
(Continued)

(58) Field of Classification Search
CPC . H01L 29/402; H01L 29/0696; H01L 21/761; H01L 29/0646; H01L 29/1058; H01L 29/66121; H01L 29/66136; H01L 29/66901; H01L 29/66893; H01L 29/4983; H01L 29/808

USPC .................................................. 257/327–335
See application file for complete search history.

(56) References Cited

U.S. PATENT DOCUMENTS 5,204,545 A    4/1993    Terashima
5,434,445 A *   7/1995    Ravanelli et al. ............. 257/488
(Continued)

FOREIGN PATENT DOCUMENTS

WO      2009109587 A1      9/2009

OTHER PUBLICATIONS

"Floating Islands and Thick Bottom Oxide Trench Gate MOSFET (FITMOS) with Passive Hole Gate-60V Ultra Low On-Resistance Novel MOSFET-" Takaya, H.; Miyagi, K.; Hamada, K. Electron Devices Meeting, 2006. IEDM '06. International Publication Year: 2006, pp. 1-4.
(Continued)

*Primary Examiner* — Jesse Y Miyoshi
*Assistant Examiner* — Stephen C Smith
(74) *Attorney, Agent, or Firm* — Michael LeStrange; Andrew M. Calderon; Roberts Mlotkowski Safran & Cole, P.C.

(57) ABSTRACT

A high-voltage LDMOS device with voltage linearizing field plates and methods of manufacture are disclosed. The method includes forming a continuous gate structure over a deep well region and a body of a substrate. The method further includes forming oppositely doped, alternating segments in the continuous gate structure. The method further includes forming a contact in electrical connection with a tip of the continuous gate structure and a drain region formed in the substrate. The method further includes forming metal regions in direct electrical contact with segments of at least one species of the oppositely doped, alternating segments.

18 Claims, 5 Drawing Sheets

(51) Int. Cl.
  *H01L 29/10* (2006.01)
  *H01L 29/49* (2006.01)
  *H01L 29/735* (2006.01)

(52) U.S. Cl.
  CPC ....... *H01L 29/7816* (2013.01); *H01L 29/7817* (2013.01); *H01L 29/7818* (2013.01)

(56) References Cited

U.S. PATENT DOCUMENTS

| | | | |
|---|---|---|---|
| 5,593,909 A * | 1/1997 | Han et al. | 438/306 |
| 5,844,272 A * | 12/1998 | Soderbarg et al. | 257/328 |
| 5,907,173 A | 5/1999 | Kwon et al. | |
| 5,959,345 A * | 9/1999 | Fruth et al. | 257/605 |
| 6,307,232 B1 | 10/2001 | Akiyama et al. | |
| 6,310,378 B1 | 10/2001 | Letavic et al. | |
| 6,348,716 B1 * | 2/2002 | Yun | 257/356 |
| 6,664,593 B2 * | 12/2003 | Peake | 257/336 |
| 6,677,642 B2 * | 1/2004 | Peake et al. | 257/335 |
| 6,825,531 B1 | 11/2004 | Mallikarjunaswamy | |
| 6,879,005 B2 | 4/2005 | Yamaguchi et al. | |
| 7,525,178 B2 | 4/2009 | Kulinsky | |
| 7,535,057 B2 | 5/2009 | Yang | |
| 7,582,533 B2 | 9/2009 | Ko | |
| 7,608,513 B2 | 10/2009 | Yang et al. | |
| 7,737,524 B2 * | 6/2010 | Letavic | 257/488 |
| 7,768,071 B2 | 8/2010 | Huang et al. | |
| 7,776,700 B2 | 8/2010 | Yang et al. | |
| 7,824,968 B2 | 11/2010 | Chu et al. | |
| 7,910,991 B2 | 3/2011 | Yang et al. | |
| 7,956,412 B2 | 6/2011 | Feilchenfeld et al. | |
| 8,148,783 B2 * | 4/2012 | Nakagawa | 257/367 |
| 8,264,038 B2 | 9/2012 | Pendharkar et al. | |
| 8,389,341 B2 | 3/2013 | Huang et al. | |
| 8,476,127 B2 * | 7/2013 | Denison et al. | 438/197 |
| 8,643,099 B2 * | 2/2014 | Denison et al. | 257/335 |
| 2002/0137318 A1 * | 9/2002 | Peake et al. | 438/585 |
| 2003/0038316 A1 | 2/2003 | Tsuchiko et al. | |
| 2003/0057497 A1 * | 3/2003 | Higashida et al. | 257/356 |
| 2003/0146476 A1 * | 8/2003 | Kaneko et al. | 257/368 |
| 2003/0173624 A1 | 9/2003 | Choi et al. | |
| 2004/0140517 A1 | 7/2004 | Tsuchiko | |
| 2004/0251499 A1 * | 12/2004 | Yamaguchi et al. | 257/343 |
| 2005/0077577 A1 * | 4/2005 | Manna et al. | 257/355 |
| 2007/0114608 A1 * | 5/2007 | Letavic | 257/347 |
| 2008/0246086 A1 | 10/2008 | Korec et al. | |
| 2008/0296684 A1 * | 12/2008 | Nozu | 257/355 |
| 2009/0039432 A1 * | 2/2009 | Nishimura et al. | 257/362 |
| 2009/0096022 A1 | 4/2009 | Chang et al. | |
| 2010/0052057 A1 | 3/2010 | Chung et al. | |
| 2011/0115017 A1 | 5/2011 | Alter et al. | |
| 2011/0260247 A1 | 10/2011 | Yang et al. | |
| 2012/0161230 A1 | 6/2012 | Satoh et al. | |
| 2012/0267715 A1 | 10/2012 | Chou et al. | |
| 2012/0299108 A1 * | 11/2012 | Harada et al. | 257/355 |
| 2013/0020632 A1 | 1/2013 | Disney | |

OTHER PUBLICATIONS

IPCOM000199574D: "Method is Disclosed for Fabricating Laterally Diffused Metal Oxide Semiconductor (LDMOS) Device with Oxide Protection Layer Over Drift Region" Disclosed Anonymously Sep. 9, 2010, 6 pages.

Z. Hossain et al, "Field-Plate Effects on the Breakdown Voltage of an Integrated High-Voltage LDMOS Transistor" The 16th International Symposium on Power Semiconductor Devices and ICs, pp. 237-240, 2004.

* cited by examiner

HIGH VOLTAGE LATERALLY DIFFUSED METAL OXIDE SEMICONDUCTOR

FIELD OF THE INVENTION

The invention relates to integrated circuits and, more particularly, to high-voltage LDMOS devices with voltage linearizing field plates and methods of manufacture.

BACKGROUND

High voltage laterally diffused metal oxide semiconductor (LDMOS) transistors are used in power management, microwave and RF power amplifiers, for example. LDMOS devices use Metal-Insulator-Silicon (MIS) surfaces and back-channel field plates to assist in depletion of the drift region, allowing more charge to be placed into the drift region, and thereby reducing on-resistance and on-state power dissipation.

Planar LDMOS devices (devices without STI) can result in superior reliability performance due to the absence of field and current crowding at STI corners; however, in known conventionally fabricated planar LDMOS devices, gate-to-drain capacitance is high, compared to an STI based device. Also, there is a fundamental tradeoff between low conduction losses (on-resistance or Rsp) and switching losses (Qgg and Qgd) and off-state breakdown voltage.

Accordingly, there exists a need in the art to overcome the deficiencies and limitations described hereinabove.

SUMMARY

In an aspect of the invention, a method comprises forming a continuous gate structure over a deep well region and a body of a substrate. The method further comprises forming oppositely doped, alternating segments in the continuous gate structure. The method further comprises forming a contact in electrical connection with a tip of the continuous gate structure and a drain region formed in the substrate. The method further comprises forming metal regions in direct electrical contact with segments of at least one species of the oppositely doped, alternating segments.

In an aspect of the invention, a method comprises forming a layer of material over a deep well implant region and a well implant region. The method further comprises forming a tongue implant region within the well implant region and extending to a well region of the substrate. The method further comprises doping the layer of material to form alternating, oppositely doped segments. The method further comprises connecting an N+ segment at a tip of the layer to a potential. The method further comprises forming metal contacts on the layer, contacting at least N+ segments of the alternating, oppositely doped segments.

In an additional aspect of the invention, a device comprises a continuous poly layer comprising a control gate and alternating, oppositely doped segments. The device further comprises an N+ segment at a tip of the layer connected to a drain. The device further comprises metal contacts on the layer, contacting at least N+ segments of the alternating, oppositely doped segments.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the structures of the present invention. In still further embodiments, a method in a computer-aided design system is provided for generating a functional design model of the structures of the present invention. The method comprises generating a functional representation of the structural elements of the structures of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to high-voltage devices with voltage linearizing field plates and methods of manufacture. In embodiments, the devices of the present invention are planar devices with superior off-state and on-state breakdown characteristics. These high-voltage devices can be LDMOS devices, a high voltage pn junction device or a high voltage JFET device, for example. Advantageously, the present invention optimizes (improves) on-state (Ron) and switching (Qg) which, in turn, improves net power dissipation while improving off-state and on-state breakdown voltage. That is, the present invention improves on state and off state breakdown voltages and device reliability, while simultaneously improving Idsat and Ron and reducing Qg, total. Also, the processes of the present invention are compatible with existing processes, thus minimizing any additional fabrication costs.

In embodiments, the high voltage device is a planar dual gate LDMOS which includes a combination of a poly field plate and, in embodiments, a metal field plate. The poly field plate is an extension of the gate poly. A buried p-tongue implant connects to a body well, which provides bottom junction for additional depletion. This enables doping the drift region heavier (lowering Ron) while maintaining off-state breakdown voltage. The poly field plate can have alternating doped segments, which form back-to-back diodes whose breakdown voltages create a linearizing potential drop. In such embodiments, when high-voltage is applied between gate and drain terminals, the leakage current through the string of back-to-back diode configurations sets up the biases across pn junctions to be equal to their breakdown voltages. These potential differences get reflected on to the underlying substrate (e.g., silicon) resulting in a near linear potential drop from drain to gate.

In further embodiments, the continuous poly field plate can have alternative doped segments connected in a manner so as to create back-to-back open base bipolar transistors whose breakdown voltage (collector to emitter punch-through voltage) creates the linearizing potential drop. In such embodiments, floating metal islands can be implemented to develop potentials due to capacitive coupling with the drain and gate electrodes. These voltages will act as collector-to-emitter voltages on an open base NPN BJT formed in the underlying poly field plate layer. Advantageously, the punch-through voltage of the NPN BJT can be controlled by the thickness and doping of the poly layer.

In a more specific embodiment, the planar dual gate LDMOS includes a silicon p-substrate and an n-well implanted in the substrate. A first N+ doped diffusion region can be implanted in the n-well. A p-well is implanted in the substrate and displaced laterally from a side of the n-well. A portion of the p-well extends within the n-well below a top surface of the n-well, e.g., tongue. An N+ doped diffusion region is implanted in the p-well of the substrate and a p+ doped diffusion region is implanted in the p-well and abutting the N+ doped diffusion region. A gate oxide insulator is deposited on the substrate and spans a region between the N+ doped diffusion regions. The gate oxide insulator tapers from a maximum thickness over a drift region of the n-well to a minimum thickness contacting the N+ doped diffusion region. A polysilicon gate structure extends between the N+ doped diffusion regions, wherein the polysilicon gate structure comprises a plurality of p-n junctions (or NPN transistors). Metal contacts are deposited on the polysilicon gate structure, each one of the plurality of metal contacts bridging a corresponding one of the plurality of P-N junctions. Alternatively, the metal contacts can be deposited on the n-type doped regions of the polysilicon gate structure.

In specific embodiments, the pn junctions are oriented to reduce an electric field across the field plate to a drift region. The pn junctions are multiple and in series, and are reverse biased. The pn junctions are connected at one end to a reference potential, where the reference potential could be the source potential or the gate potential. In embodiments, the pn junctions form an open base bipolar configuration, where the base of the bipolar transistors is floating and the collector and emitter are connected to a metal island. The series connected pn junctions are connected at both ends to different reference potentials. In embodiments, one reference is gate, source, or an arbitrary reference potential, and the second reference is drain or an arbitrary reference potential.

FIGS. 1-8 show structures and respective processing steps in accordance with aspects of the present invention. It should be understood by those of skill in the art that the process of manufacturing the high-voltage LDMOS devices of the present invention can be manufactured in a number of ways using a number of different tools. In general, though, the methodologies and tools are adopted from integrated circuit (IC) technology to form the structures with certain dimensions. For example, the structures of the present invention, e.g., gate structures, patterned arrays, field plates, etc., are built on wafers and are realized in films of materials patterned by photolithographic processes. In particular, the fabrication of the structures uses three basic building blocks: (i) deposition of films of material on a substrate, (ii) applying a patterned mask on top of the films by photolithographic imaging, and (iii) etching the films selectively to the mask.

Figure 1:
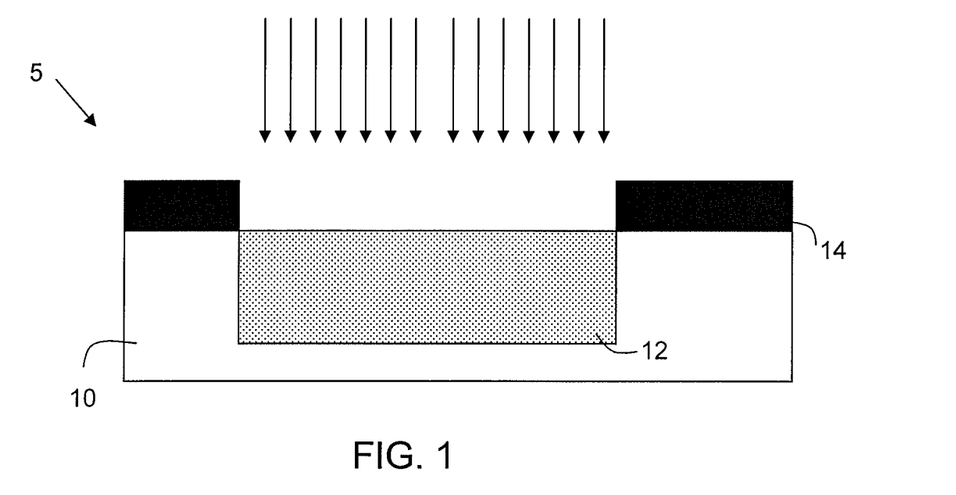
FIGS. 1-7 show structures and respective processing steps in accordance with an aspect of the present invention.

More specifically, as shown in FIG. 1, a starting structure 5 includes a substrate 10, e.g., p-type substrate. In embodiments, the substrate 10 can be any layer of a device and more preferably an active semiconductor layer. As should be understood by those of skill in the art, the substrate 10 can be implemented in either an SOI wafer or BULK implementation, as examples. The constituent materials of the SOI wafer or BULK implementation may be selected based on the desired end use application of the semiconductor device. For example, the active semiconductor layer can be comprised of various semiconductor materials, such as, for example, Si, SiGe, SiC, SiGeC, etc. The SOI wafer may be fabricated by conventional processes including, but not limited to, oxygen implantation (e.g., SIMOX), wafer bonding, etc.

Still referring to FIG. 1, a deep well 12 is formed in the substrate 10 using conventional implantation processes. In embodiments, the deep well 12 is a deep N-well formed by implanting phosphorous into the substrate 10. In embodiments, the deep well 12 can be formed by other N-type dopants such as, for example, arsenic or antimony. In embodiments, the deep well 12 can extend very deep into the substrate, and the depth can varying depending on design specification, as one of skill in the art should understand. In embodiments, the deep well 12 is defined by a resist pattern 14, which is formed by a deposition and development process known to those of skill in the art such that no further explanation is required herein for an understanding of the invention.

Figure 2:
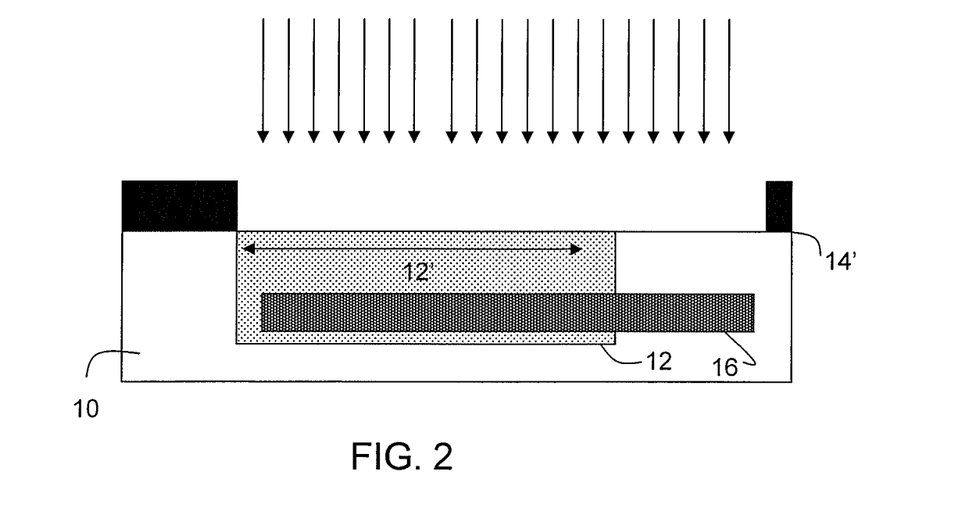

In FIG. 2, a buried tongue 16 is formed in the substrate 10, extending to within portions of the deep well 12. In embodiments, the buried tongue 16 is a P-doped implant region, formed by implanting boron into the substrate 10; although other P-type dopants are also contemplated by the present invention, e.g., Indium. In embodiments, the buried tongue 16 can be formed to a depth of about a half deep n-well; although other depths are also contemplated by the present invention. The buried tongue 16 is defined by a resist pattern 14', which is formed by a deposition and development process known to those of skill in the art such that no further explanation is required herein for an understanding of the invention. The buried tongue 16 is connected to a body well (see, e.g., FIG. 3) to provide bottom junction for additional depletion, which enables a heavier doping of a drift region 12' (e.g., lowering Ron) while maintaining off-state breakdown voltage. In embodiments, the drift region 12' can be formed by an n-doped ion implanting process, as should be known to those of skill in the art.

Figure 3:
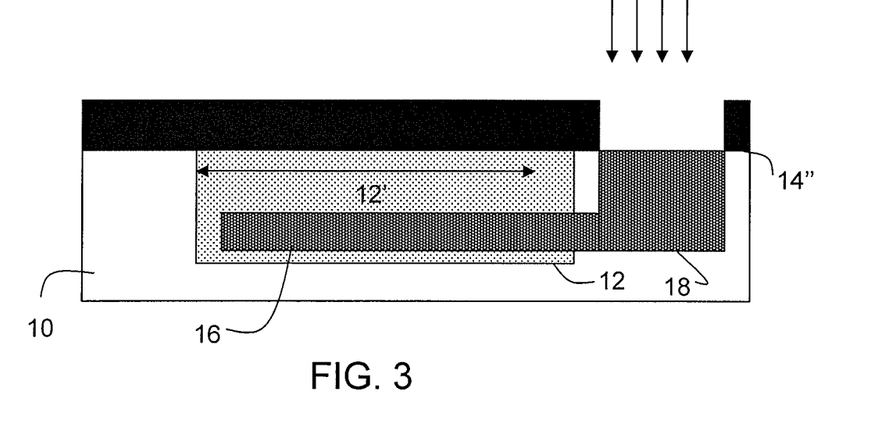

In FIG. 3, a P-well 18 is formed in the substrate 10, extending to and in contact with the buried tongue 16. As should be understood by those of skill in the art, the buried tongue 16 connected to the body well, i.e., P-well 18, will improve back-gate depletion. In embodiments, the P-well 18 is a P-doped implant region, formed by implanting boron into the substrate 10; although other P-type dopants are also contemplated by the present invention, e.g., Indium. In embodiments, the P-well 18 is defined by a resist pattern 14", which is formed by a deposition and development process known to those of skill in the art such that no further explanation is required herein for an understanding of the invention.

Figure 4:
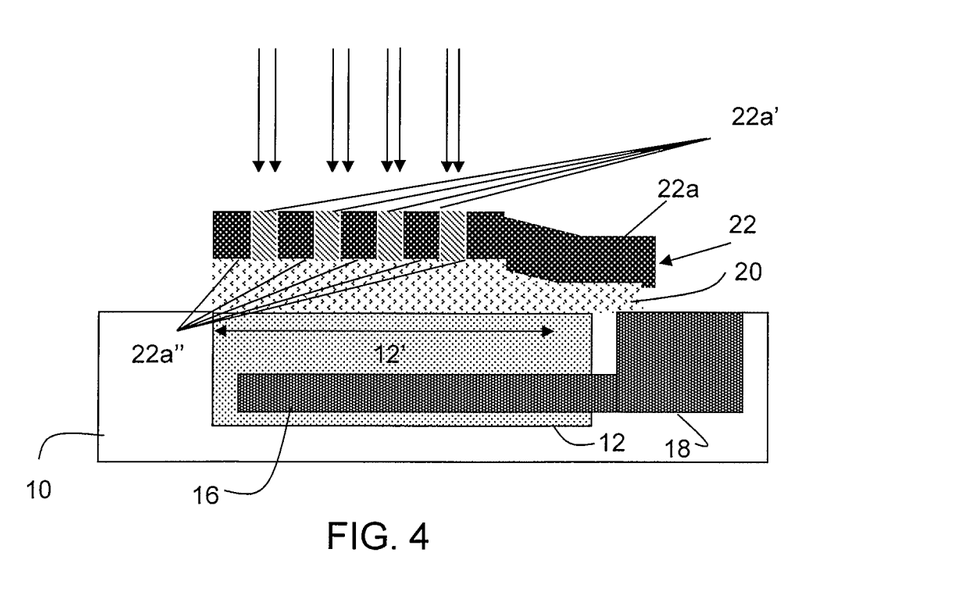
Figure 7:
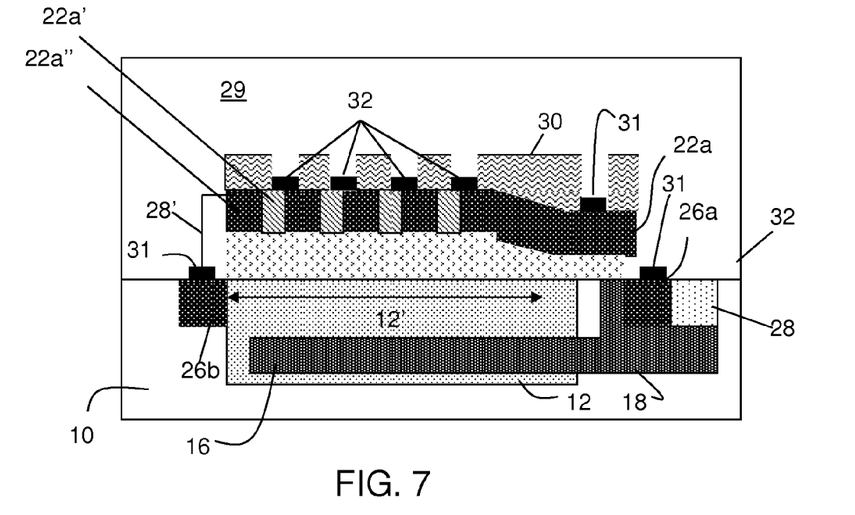

FIG. 4 shows several additional processes in accordance with aspects of the present invention. Specifically, in FIG. 4, a dielectric layer 20 is formed over the deep well 12 and extending to the P-well 18. In embodiments, the dielectric layer 20 can be any insulator layer, and is preferably an oxide layer. In embodiments, for example, the dielectric layer 20 can be $SiO_2$, $HfO_2$ or other high-k dielectric material. In further embodiments, the dielectric layer 20 can also be a nitride material. The dielectric layer 20 can be a gate insulator which tapers from a maximum thickness over the drift region 12' of the n-well 12 to a minimum thickness over the region 18 (and more specifically as shown in FIG. 7, an N+ doped region).

In embodiments, the dielectric layer 20 can be formed by using conventional deposition, lithography and etching processes. For example, the dielectric layer 20 can be deposited using conventional chemical vapor deposition (CVD) processes, including for example, a plasma enhanced CVD (PECVD) process. In embodiments, the dielectric layer 20 can have any designed thickness. A resist can be formed over the dielectric layer 20 and exposed to energy (light) to form a pattern. The dielectric layer 20 then undergoes an etching process, e.g., reactive ion etching (RIB), in order to form its final shape. In embodiments, the resist can then be stripped by an oxygen ashing process.

Still referring to FIG. 4, a poly layer 22 is deposited on the dielectric layer 20 to form a continuous gate structure. In embodiments, the poly layer 22 can be P-type doped material, N-type doped material or non-doped material, formed using any conventional deposition methods as described herein. In any of the embodiments, the poly layer 22 forms a control gate 22a and, in embodiments, is doped (e.g., using ion implantation processes) with certain species to form an array of alternating oppositely doped segments 22a' and 22a" over the deep well 12. The alternating oppositely doped segments 22a' and 22a" form back-to-back diodes, i.e., forward biased pn junctions.

By way of example, by masking selected segments, an N-type poly layer 22 can be doped with a P-type dopant, e.g., boron or Indium, to form alternating N-type segments 22a" and P-type segments 22a'. Alternatively, a P-type poly layer 22 can be doped with an N-type dopant, e.g., phosphorous, arsenic or antimony, to form alternating N-type segments 22a" and P-type segments 22a'. As another alternative, the poly layer 22 can be non-doped material and through separate doping steps (e.g., masking and ion implanting steps), the poly layer 22 can be doped with N-type dopant and P-type dopant to form the alternating N-type segments 22a" and P-type segments 22a'. In embodiments, the P-type dopant and/or the N-type dopant can be implanted at an energy level of about 1e19 or higher to form multiple and in series forward bias pn junctions.

Figure 5:
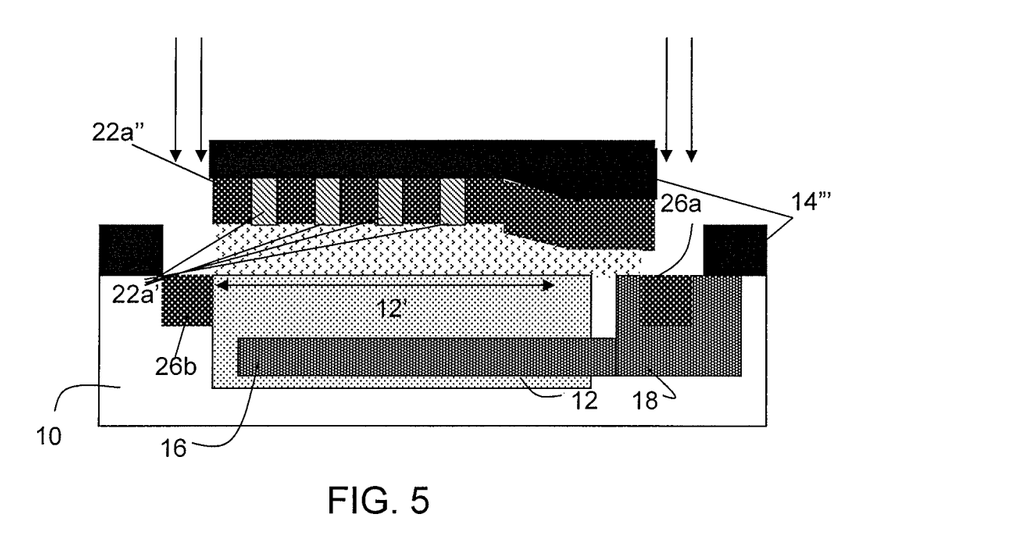

In FIG. 5, the structure undergoes an implantation process to form a source region 26a and a drain region 26b. For example, in FIG. 5, blocking resist 14' is formed over the N-type segments 22a' and P-type segments 22a", and an ion implantation process is performed to form the source region 26a and a drain region 26b. The blocking resist 14' can then be removed using conventional stripping processes. The drift region 12' is defined within the deep well 12, e.g., between the drain region 22a and a body of the device.

Figure 6:
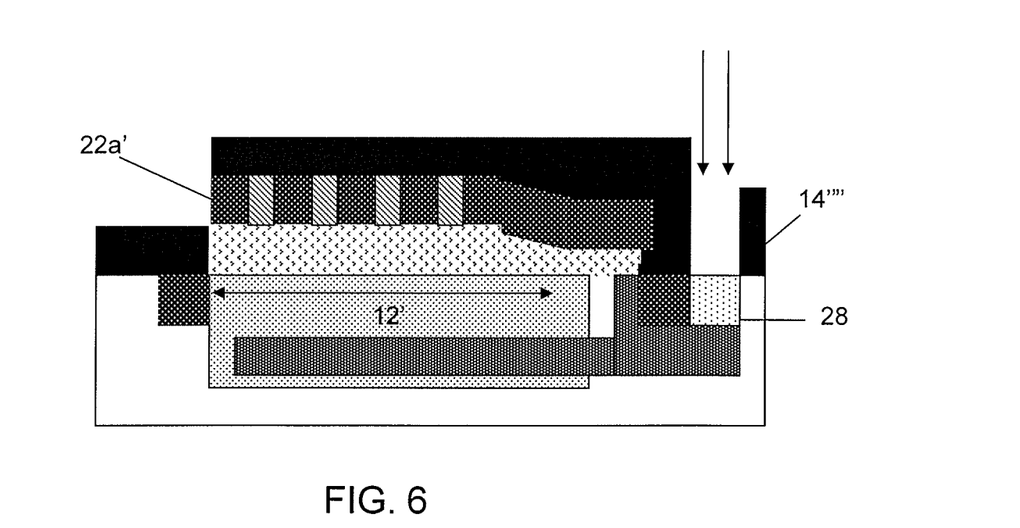

In FIG. 6, a P+ implant region 28 (body portion) is formed in the P-well 18, using conventional implantation processes. In embodiments, the P+ implant is boron or indium, for example. The P+ implant region 28 can be formed using conventional processes, as already described herein which includes the use of a blocking resist 14'.

FIG. 7 shows additional processing steps in accordance with aspects of the present invention. More specifically, FIG. 7 shows a silicide process in addition to the formation of a metal contact 28' in contact with the drain region 26b and a tip of the poly layer 22, e.g., N+ segment 22a". In this way, the pn junctions can be connected at both ends to different reference potentials. For example, at one end the pn junctions can be connected to a reference potential, e.g., source potential or the gate potential and at the other end to a second reference, e.g., drain 26b or an arbitrary reference potential.

In particular, the silicide process can include, for example, the formation of a masking material 30, e.g., SiN, and a subsequent patterning to form openings corresponding to silicided regions. Metal is deposited within the openings using conventional metal deposition processes. For example, a metal, e.g., TiN, $Co_3N_2$, Ni, etc., can be deposited on the exposed regions, e.g., source region 26a, drain region 26b, control gate 22a and spanning between the N-type segments 22a" and P-type segments 22a', using a metal sputtering technique. The deposited metal can then undergo an annealing process, e.g., rapid thermal anneal at about 600° C. to 900° C. In this way, silicide regions 31 are formed on the source region 26a, drain region 26b, control gate 22a to lower the contact resitivity of such regions. Also, silicide regions 32 are formed in contact with the N-type segments 22a" and P-type segments 22a', effectively shorting the forward bias pn junction. This, in effect, will ensure that there are reduce any leakage from forward biased p-n junctions.

In embodiments, the metal contact 28' is formed in contact with the drain region 26b and a tip of the poly layer 22, e.g., N+ segment 22a", using conventional lithography and deposition methods. For example, the metal contact 28' can be a combination of a stud (metal via) and wiring layer formed in an interlevel dielectric material 29, e.g., oxide or nitride, using a subtractive and/or additive process, as known to those of skill in the art. Specifically, for example, the interlevel dielectric material 29 can be deposited using, for example, any conventional CVD methods known to be used for the deposition of dielectric material. A resist is formed over the interlevel dielectric material 29, and is patterned by exposure to energy (light) to form openings. Metal can then be deposited within the openings using known metal deposition processes, e.g., metal sputtering, to form a metal via and subsequent wiring layer. In embodiments, the stud can be any metal such as, for example, copper, tungsten or aluminum, to name a few examples. The wiring layer, on the other hand, can be a metal such as, for example, aluminum or copper.

Figure 8:
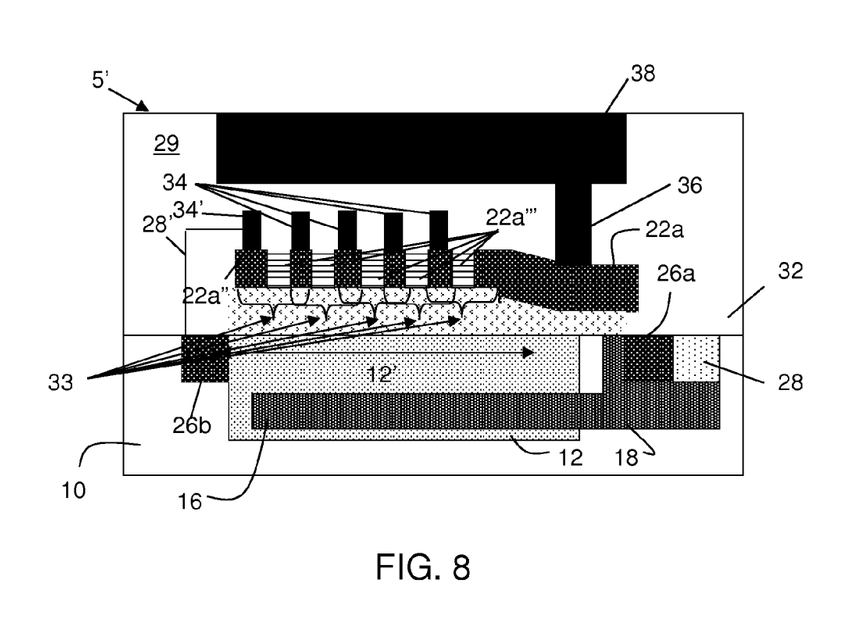
FIG. 8 shows a structure and respective processing steps in accordance with another aspect of the present invention.

FIG. 8 shows a structure and respective processing steps in accordance with another aspect of the present invention. More particular, the structure 5' includes a poly layer 22 which has alternating lightly doped P-type regions 22''', e.g., about 1e17 or lower, and more heavily doped N-type regions 22", e.g., about 1e19 or above, to form back-to-back open base bipolar transistors, e.g., NPN bipolar transistors 33. The lightly doped regions, for example, enable larger voltage drops along the gate structure 22, resulting in lower fields and higher breakdown voltages. As should be understood by those of skill in the art, the interior N+ doped regions 22" can act as both a collector and emitter, whereas, the lightly doped P-type regions 22''' act as a base. The back-to-back open base bipolar transistors, e.g., NPN bipolar transistors 33, can be formed in a similar manner to the back-to-back diodes, as described with reference to FIG. 4.

Still referring to FIG. 8, floating metal islands 34 are formed in the interlevel dielectric material 29, formed using conventional lithography and deposition methods as described herein. In embodiments, the floating metal islands 34 are formed in direct structural and electrical contact with the N-type regions 22". The floating metal islands 34 can be representative of a metal via and wiring layer combination, formed using a subtractive and/or additive process, as already described herein. Similarly, the metal contact 28' can be formed in structural and electrical contact with the drain region 26b and the floating metal island 34', which is in structural and electrical contact with the tip of the poly layer 22, e.g., N+ segment 22a". Alternatively, the metal contact 28' can be formed in direct structural and electrical contact with the drain region 26b and the tip of the poly layer 22, e.g., N+ segment 22a".

A metal via 36 is also formed in contact with the control gate 22a, using processes similar to the formation of a contact stud, as described herein. A metal wiring shield 38 is formed in direct structural and electrical contact with the control gate 22a, using the metal via 36. In embodiments, the metal wiring shield 30 is formed over the entire poly layer 22, and preferably over the metal islands 34. In this way, the metal wiring shield 38 will completely shield the poly gate 22. Accordingly, the metal wiring shield 38 will provide improved capacitive coupling connected to the gate poly and a higher K-dielectric between the metal wiring shield 38 and the poly gate 22 will result in stronger coupling. As such, in this configuration, the floating metal islands will develop potentials due to capacitive coupling with the drain and gate electrodes. These voltages will act as collector-to-emitter voltages on an open base NPN BJT formed in the underlying poly layer 22a, where the punch-through voltage of the NPN BJT can be controlled by the thickness and doping of the poly layer 22a.

In forming the metal wiring shield 38, in embodiments, an interlevel dielectric layer 29 is deposited over the poly gate 22 and the control gate 22a (and other exposed structures). The deposition process can be, for example, CVD; although, other deposition processes are contemplated by the present invention. A via is formed in the interlevel dielectric layer 29 using conventional lithography and etching processes. A metal, e.g., tungsten, copper or aluminum, is deposited in the via to form the metal via 36. The metal can be deposited in the via using conventional deposition methods including, for example, sputtering techniques, electroplating, atomic layer deposition (ALD), or other conventional deposition methods. Any residual metal can be removed using a conventional polishing process, e.g., chemical mechanical polishing (CMP). The interlevel dielectric layer 29 can also undergo a planarization process, during this polishing process.

The metal wiring shield 38 is formed by an additive or subtractive process. For example, in a subtractive process, a metal, e.g., tungsten, copper or aluminum, is deposited on the interlevel dielectric layer 29 using conventional deposition methods including, for example, CVD. A resist is formed over the metal and is patterned by exposing it to energy (light). The metal is then patterned using a conventional etching process. The resist is removed using an oxygen ashing process, following by deposition of additional interlevel dielectric material, e.g., oxide.

It should now be understood that the high-voltage LDMOS devices of the present invention comprise a reduced surface field setup by a linear potential drop across the drift region. The linear potential drop is created by, for example, back-to-back diodes formed within a continuous field plate (poly layer) or a field plate with floating metal islands connected in an open base bipolar configuration with an underlying continuous poly layer.

Flow Diagram

Figure 9:
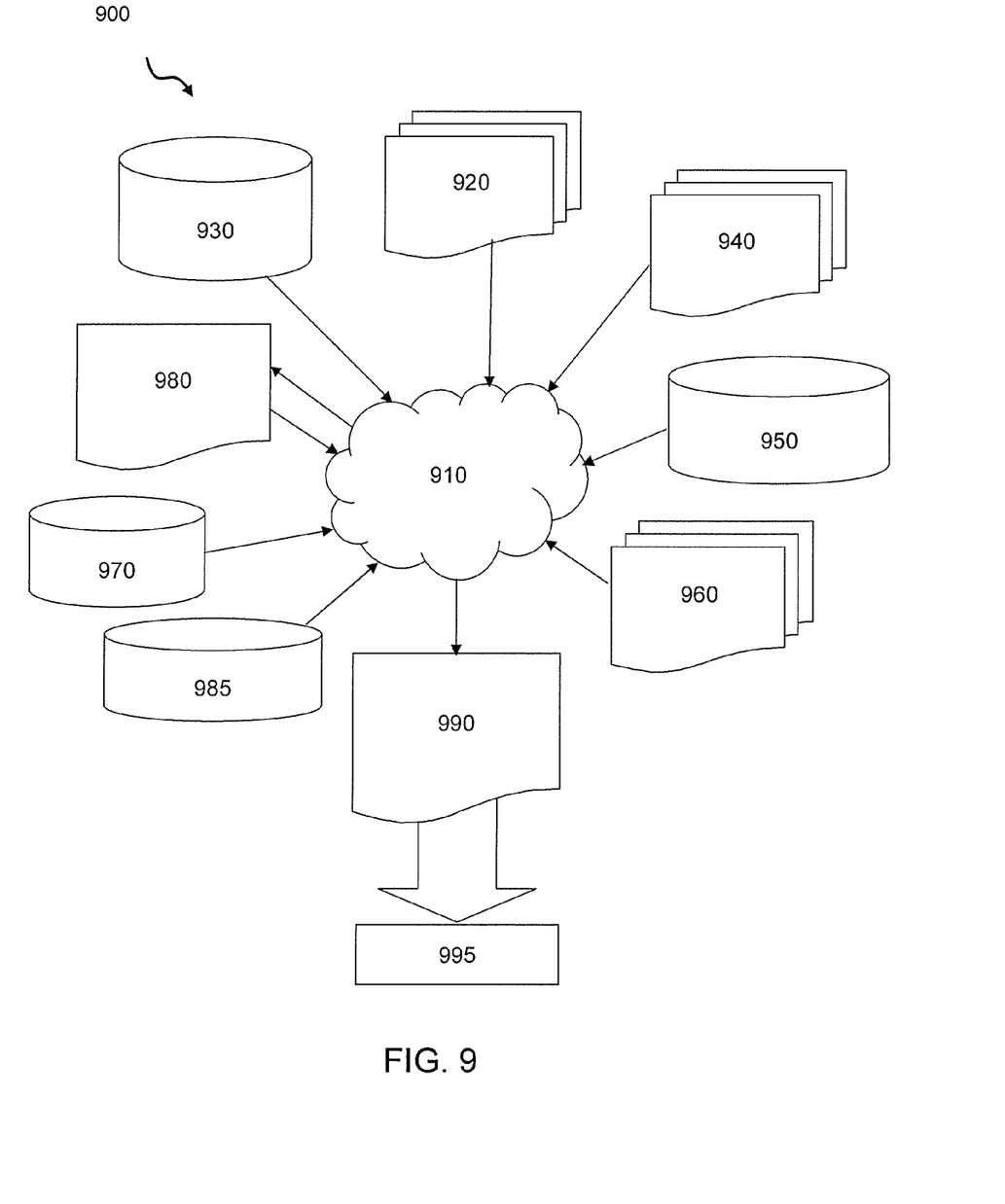
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming a continuous gate structure over a deep well region and a body of a substrate;
   forming oppositely doped, alternating segments in the continuous gate structure the alternating segments including first segments having a first conductivity type and second segments having a second conductivity type, the second segments respectively being located between adjacent first segments;
   forming metal islands respectively in contact with the first segments, with the second segments being devoid of the metal islands, such that each of the first segments has a metal island formed thereon; and
   forming a contact in direct electrical connection with one of the metal islands formed over one of the first segments located at a tip of the continuous gate structure and with a drain region formed in the substrate to form a direct electrical connection between the drain region and the one of the metal islands formed over the one of the first segments located at the tip of the continuous gate structure.

2. The method of claim 1, wherein the oppositely doped, alternating segments are alternating P+ and N+ regions, forming back-to-back diodes with forward bias pn junctions.

3. The method of claim 2, wherein the forming the metal islands comprises a silicide process.

4. The method of claim 3, wherein the forming the contact includes forming a wiring.

5. The method of claim 2, wherein the pn junctions are in series.

6. The method of claim 1, wherein the oppositely doped, alternating segments are alternating P and N+ regions, forming back-to-back open base NPN bi-polar transistors.

7. The method of claim 6, wherein the P regions are lightly doped, compared to the N+ regions.

8. The method of claim 6, further comprising forming a metal shield over and spaced apart from the metal islands, and connected to the continuous gate structure with a metal a configuration.

9. The method of claim 8, wherein the metal shield is formed in electrical connection with a control gate portion of the continuous gate structure.

10. The method of claim 6, wherein the contact is formed in electrical contact with one of the metal islands formed in contact with an N+ region at the tip of the continuous gate structure.

11. The method of claim 1, further comprising forming an implanted tongue region within the deep well region and extending to the body, wherein the continuous gate structure is formed over the implanted tongue region.

12. A method, comprising:
forming a layer of material over a deep well implant region and a well implant region in a substrate, the deep well implant region and the well implant region being separated from one another by a portion of the substrate;
forming a tongue implant region within the deep well implant region and extending to the well implant region of the substrate;
doping the layer of material to form alternating, oppositely doped segments to form a continuous gate structure, the alternating oppositely doped segments including first segments having a first conductivity type and second segments having a second conductivity type, the second segments respectively being located between adjacent first segments;
forming metal islands respectively in contact with the first segments, the second segments being devoid of the metal islands, such that each of the first segments has a metal island formed thereon; and
forming a contact in direct electrical connection with one of the metal islands formed over one of the first segments located at a tip of the continuous gate structure and with a drain region formed in the substrate to form a direct electrical connection between the drain region and the one of the metal islands formed over the one of the first segments located at the tip of the continuous gate structure.

13. The method of claim 12, wherein:
the oppositely doped, alternating segments are alternating P+ and N+ segments, forming back-to-back diodes with forward bias pn junctions; and
the metal islands are formed by a silicide process.

14. The method of claim 12, wherein:
the oppositely doped, alternating segments are alternating P and N+ segments, forming back-to-back open base NPN bi-polar transistors; and
the P regions are lightly doped, compared to the N+ segments.

15. The method of claim 14, further comprising forming a metal shield over and spaced apart from the metal islands, and connected to a control gate.

16. The method of claim 14, wherein the metal islands are configured to develop potentials due to capacitive coupling with drain and gate electrodes.

17. The method of claim 12, wherein the layer is a poly material.

18. The method of claim 12, wherein the method further comprises connecting another N+ segment at an opposite tip of the layer to another potential different from the potential.

* * * * *